(12) United States Patent
Taura et al.

(10) Patent No.: US 6,901,146 B1
(45) Date of Patent: May 31, 2005

(54) ALL-DIGITAL FM STEREO DEMODULATOR AND DEMODULATION METHOD

(75) Inventors: Kenichi Taura, Tokyo (JP); Masayuki Tsuji, Tokyo (JP); Masahiro Tsujishita, Tokyo (JP); Masayuki Ishida, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 704 days.

(21) Appl. No.: 09/723,291

(22) Filed: Nov. 28, 2000

(30) Foreign Application Priority Data

Dec. 21, 1999 (JP) .......................................... 11/362251

(51) Int. Cl.⁷ .............................................. H04H 5/00
(52) U.S. Cl. ................................................ 381/3
(58) Field of Search ........................... 381/3, 7, 2, 1; 375/340; 708/313

(56) References Cited

U.S. PATENT DOCUMENTS

| | | | |
|---|---|---|---|
| 5,357,544 A | | 10/1994 | Horner et al. |
| 5,404,405 A | * | 4/1995 | Collier et al. .................. 381/7 |
| 5,471,534 A | | 11/1995 | Utter |
| 6,694,026 B1 | * | 2/2004 | Green ........................... 381/3 |

FOREIGN PATENT DOCUMENTS

| | | |
|---|---|---|
| EP | 0 540 195 A2 | 5/1993 |
| JP | 64-7735 A | 1/1989 |
| JP | 9-74364 | 3/1997 |
| JP | 10-163898 A | 6/1998 |
| JP | 11-186926 | 7/1999 |
| JP | 2001-522205 A | 11/2001 |
| WO | WO99/23821 A1 | 5/1999 |

OTHER PUBLICATIONS

Haug et al., A DSP–Based Stereo Decoder or Automotive Radio, 8 pgs.

* cited by examiner

*Primary Examiner*—Stella Woo
(74) *Attorney, Agent, or Firm*—Birch, Stewart, Kolasch & Birch, LLP

(57) ABSTRACT

A stereo composite signal including a pilot signal is demodulated by processing input samples to obtain internal samples having variable sampling timings, synchronizing these sampling timings with the pilot signal, and digitally processing the internal samples to obtain stereo audio data. The internal samples may be obtained from the input samples by decimation or interpolation. Since the sampling frequency and sampling timing of the input samples do not have to be precisely controlled, no voltage-controlled oscillator is needed, and the demodulator can easily be incorporated into a monolithic integrated circuit.

22 Claims, 17 Drawing Sheets

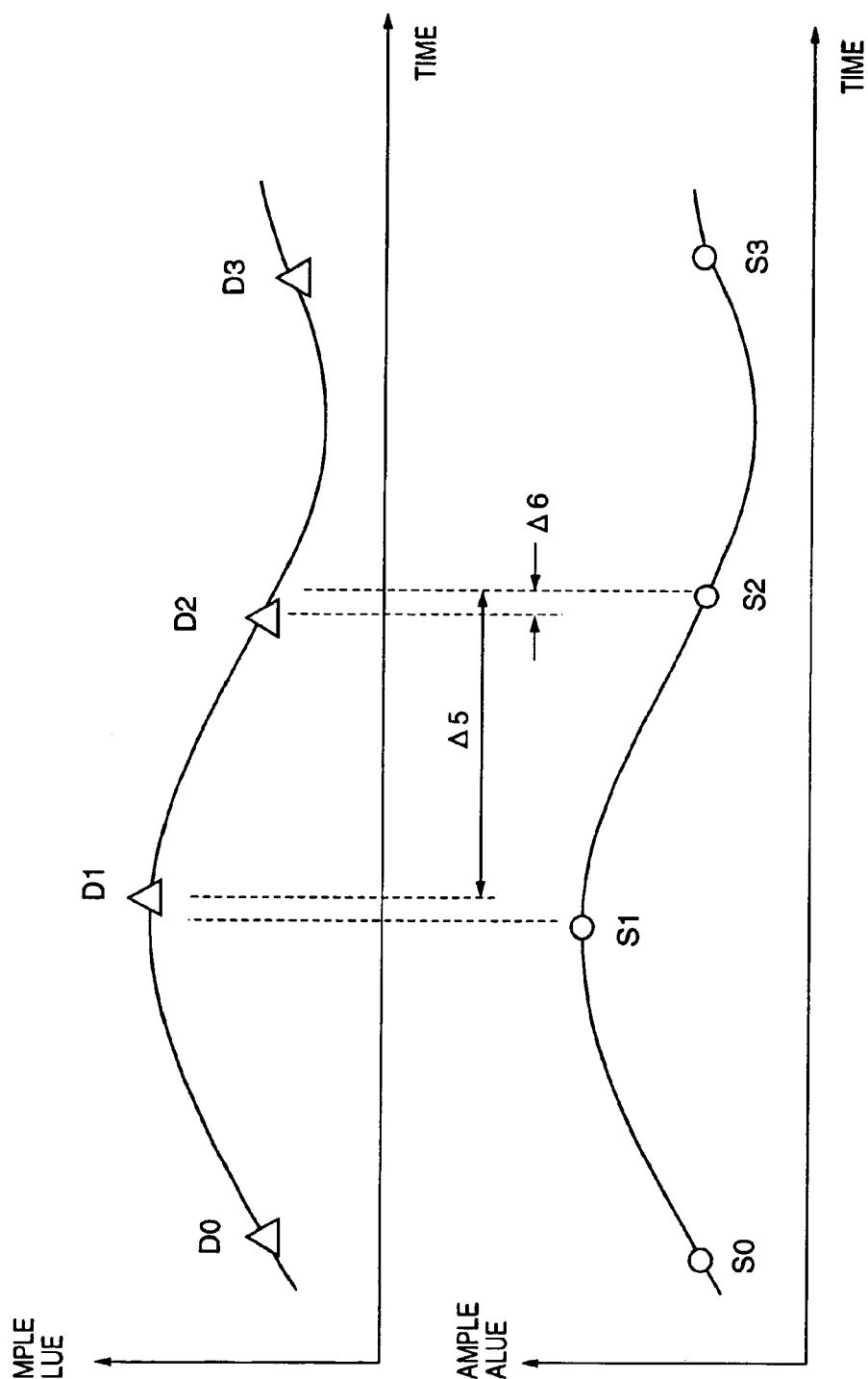

ALL-DIGITAL FM STEREO DEMODULATOR AND DEMODULATION METHOD

BACKGROUND OF THE INVENTION

This invention relates to a frequency-modulation (FM) stereo demodulator based entirely on digital signal processing, for use in an FM audio broadcast receiver.

FM stereo demodulators of the switching type, with analog circuitry, have long been used in FM audio broadcast receivers, but as the density of integrated circuits rises, digital circuit configurations are becoming advantageous due to their small size and their compatibility with digital broadcast receiver circuits.

The input to a digital FM stereo demodulator is conventionally a stereo composite signal that has been sampled in synchronization with a sampling clock output by a voltage-controlled oscillator (VCO) or voltage-controlled crystal oscillator (VCXO). If the stereo composite signal is sampled at the right times, it can be demodulated to left-channel and right-channel stereo audio signals simply by selection of certain subsets of the input samples. The functions of a conventional digital FM stereo demodulator accordingly include selecting the relevant input samples, generating an error signal for control of the VCO or VCXO, converting the error signal to an analog signal, and filtering the analog signal for input to the VCO or VCXO. Further details will be given later.

The need for a digital-to-analog converter and analog filter for the error signal is a disadvantage, because these components take up space, and the analog filter in particular cannot easily be integrated with digital signal-processing circuits. The need for an external VCO or VCXO is likewise a disadvantage. The effect of these disadvantages is to increase the parts count and manufacturing cost of the conventional FM stereo demodulator.

SUMMARY OF THE INVENTION

An object of the present invention is to provide a digital FM stereo demodulator that does not require precise control of its input sampling timing.

Another object of the invention is to provide a digital FM stereo demodulator that can be easily implemented in a monolithic integrated circuit.

Still another object is to relax filtering performance requirements in a digital FM stereo demodulator.

Yet another object is to provide audio output data suitable for the use of simple digital-to-analog converters. The invented method of demodulating a stereo composite signal includes the steps of:

(a) obtaining input samples of the stereo composite signal sampled at a fixed sampling frequency;

(b) processing the input samples to obtain internal samples having variable sampling timings;

(c) generating a reference signal according to the variable sampling timings;

(d) detecting a phase difference between the reference signal and a pilot signal included in the stereo composite signal;

(e) varying the variable sampling timings according to the detected phase difference; and (f) digitally processing the internal samples to obtain stereo audio data.

When this method is employed, the sampling frequency and sampling timing of the input samples do not have to be precisely controlled, because the timing of the internal samples is controlled instead.

The invention also provides a digital FM stereo demodulator having means for performing the above steps. This digital FM stereo demodulator is easy to implement in a monolithic integrated circuit because, as it does not require an external voltage-controlled oscillator for timing control, it does not require a digital-to-analog converter and analog filter for the phase difference signal.

Steps (b) and (e) may be carried out by decimating the input samples with a variable decimation interval. Periodic adjustment of the decimation interval makes possible fine adjustment of the internal sampling frequency with minimum effect on the timing of other steps in the demodulation process.

Alternatively, steps (b) and (e) may be carried out by performing an interpolation process on the input samples, using the interpolated samples as the internal samples, and varying the interpolation filter coefficients. The internal sampling timing can then be varied without the need for a high input sampling frequency.

When interpolation is employed in step (b), the digital FM stereo demodulator may have a filter coefficient table storing different sets of filter coefficients yielding internal samples interpolated at different temporal distances from a most recent input sample. Step (e) can then be carried out simply by selecting different sets of filter coefficients from the plurality of stored sets. The stored sets of filter coefficients include at least a first set yielding an interpolated sample closest to the most recent input sample, and a second set yielding an interpolated sample farthest from the most recent input sample.

In this case, in step (b), generation of an internal sample for the most recent input sample is preferably skipped when the filter coefficients are changed from the first set to the second set, and two internal samples are preferably generated, using both the first and second sets of filter coefficients, when the filter coefficients are changed from the second set to the first set. The spacing of the internal samples can then be kept substantially even.

It is also preferable to delay the start of the interpolation process according to the temporal distance of the interpolated sample from the most recent input sample. The interpolation process can then be performed at substantially regular intervals, even when the filter coefficient are switched between the first set and the second set. Requirements on the speed of the interpolation process are thereby relaxed, and possible distortion of the audio output is avoided.

Step (f) may include an interpolation process performed on the internal samples to generate stereo audio data at regular intervals. This permits the use of relatively simple and inexpensive digital-to-analog converters for the audio data.

Step (f) may include generating a pilot replica signal from the internal samples, and subtracting the pilot replica signal from the internal samples to cancel the pilot signal. Residual audio distortion due to the pilot signal is thereby reduced, and low-pass filtering requirements for the stereo audio data are relaxed.

BRIEF DESCRIPTION OF THE DRAWINGS

In the attached drawings:

FIGS. 14A, 15A, and 16A show examples of internal samples and in the fifth embodiment;

FIGS. 14B, 15B, and 16B show corresponding examples of interpolated audio data in the fifth embodiment.

DETAILED DESCRIPTION OF THE INVENTION

Figure 1:
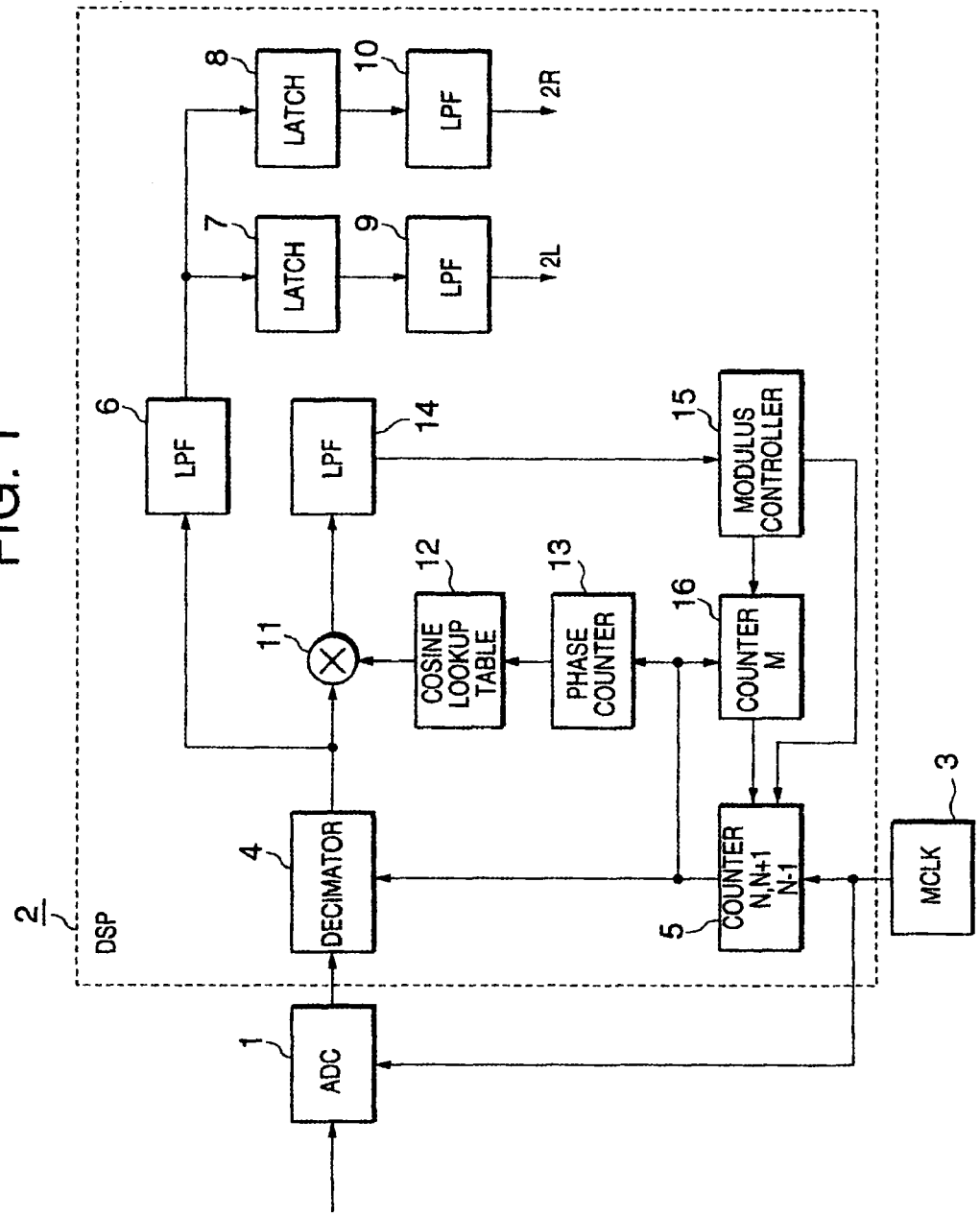
FIG. 1 is a block diagram of a digital FM stereo demodulator illustrating a first embodiment of the invention.

Embodiments of the invention will now be described with reference to the attached drawings. A more detailed explanation of relevant aspects of the prior art will also be given. Corresponding elements will be identified by identical reference characters throughout the drawings.

Figure 17:
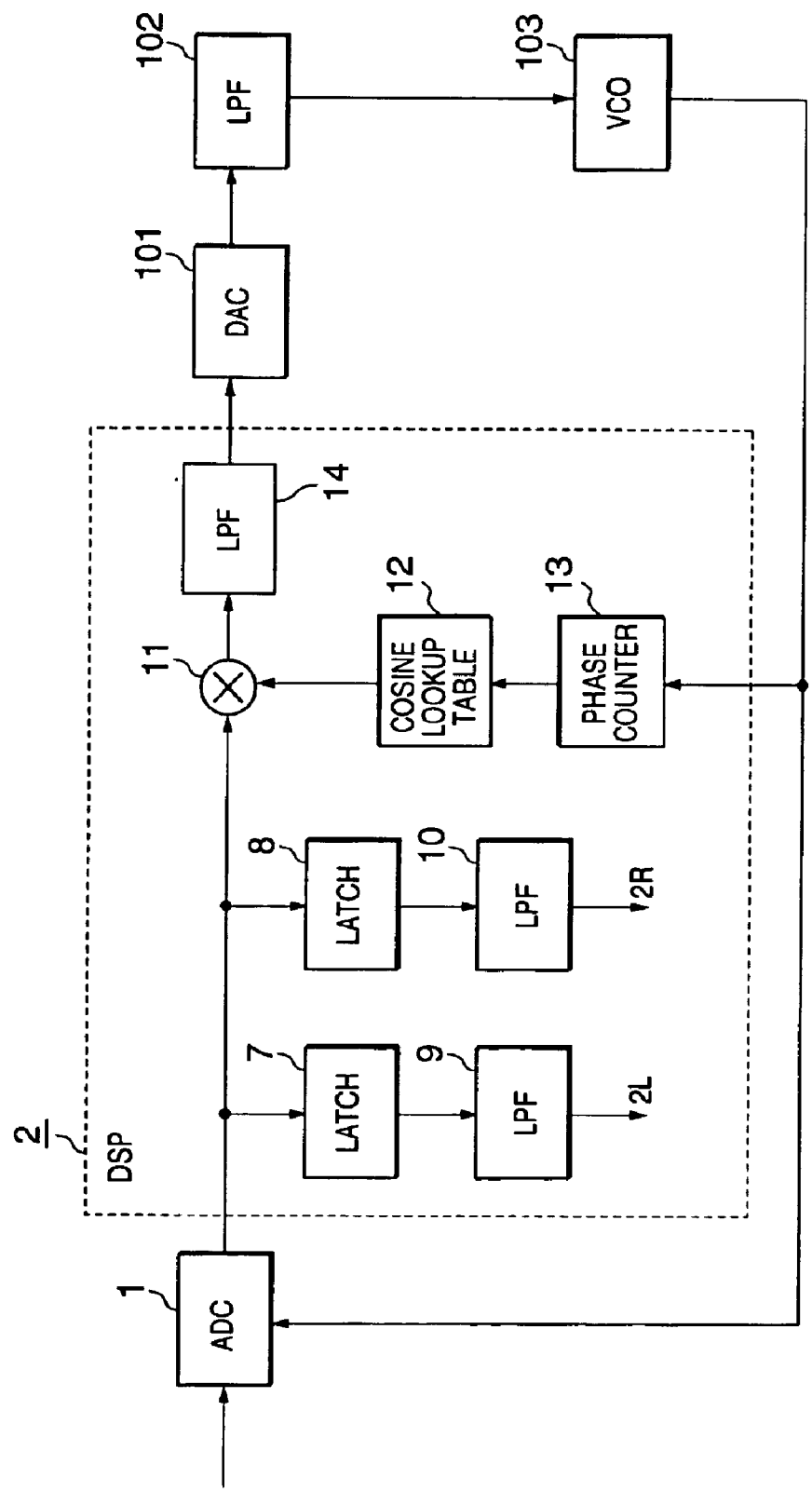
FIG. 17 is a block diagram of a conventional digital FM stereo demodulator.

As an example of the prior art, FIG. 17 shows a digital FM stereo demodulator described in "A DSP-Based Stereo Decoder for Automotive Radio" by J. E. Haug et al., SAE Technical Paper Series, #900244, February 1990. The demodulator includes an analog-to-digital converter (ADC) 1, a digital signal processor (DSP) 2, a digital-to-analog converter (DAC) 101, an analog low-pass filter (LPF) 102, and a voltage-controlled oscillator (VCO) 103. The DSP 2 includes a first data storage means or latch 7, a second latch B, low-pass filters 9, 10, 14, a multiplier 11, a cosine look-up table 12, and a phase counter 13.

The ADC 1 receives a baseband signal that has already undergone FM demodulation. The baseband signal is a temporally continuous analog stereo composite signal including a left-right sum component, a nineteen-kilohertz (19-kHz) pilot-signal component, and a left-right difference component. This last component is modulated onto a suppressed 38-kHz subcarrier wave. The ADC 1 takes discrete-time samples of the baseband signal in synchronization with a sampling clock signal output by the VCO 103, and supplies the samples to the DSP 2.

In the DSP 2, the first and second latches 7, 8 latch input samples designated by the phase counter 13, which counts sampling clock cycles, and output the latched sample data to the first and second low-pass filters 9, 10. The latches 7, 8 operate as resampling devices, resampling the input signal with respective sampling frequencies of substantially 38 kHz, with respectively different sampling timings. The low-pass filters 9, 10 remove unwanted high-frequency components from the resampled signals, and output a left-channel audio signal 2L and a right-channel audio signal 2R, respectively, as stereo audio data.

All of the input samples are also multiplied in the multiplier 11 by cosine-wave data read from the cosine look-up table 12. The cosine-wave data are read from addresses designated by the phase counter 13. The cosine look-up table 12 and phase counter 13 operate so as to generate a reference signal with a frequency substantially matching the 19-kHz frequency of the pilot signal, and a phase synchronized with the sampling of the input stereo composite signal. The signal output by the multiplier 11 includes a low-frequency component substantially proportional to the phase difference between the reference signal and the pilot signal. The third low-pass filter 14 extracts this low-frequency component as a phase error signal.

The phase error signal, which is output from the DSP 2 as a digital signal, is converted to an analog signal by the DAC 101, and supplied as a control voltage signal to the VCO 103, after unwanted high-frequency components have been rejected by the analog low-pass filter 102. The phase error signal controls the oscillation frequency of the VCO 103, hence the sampling frequency and timing of the ADC 1, forming a feedback control loop. This loop operates so as to synchronize the phase of the reference signal read from the cosine look-up table 12 with the phase of the pilot signal, hence to synchronize the sampling of the input signal according to the pilot signal.

The stereo demodulation operation can be described mathematically by the following five equations.

$$S(t)=[L(t)+R(t)]+[L(t)-R(t)]\sin(2\omega t)+A_p\sin(\omega t) \quad (1)$$

$$P(t)=\Sigma\delta(t-(2n+\tfrac{1}{2})T) \quad (2)$$

$$Q(t)=\Sigma\delta(t-(2n+\tfrac{3}{2})T) \quad (3)$$

$$S(t)P(t)=\Sigma 2L(t-(2n+\tfrac{1}{2})T)\delta(t-(2n+\tfrac{1}{2})T) \quad (4)$$

$$S(t)Q(t)=\Sigma 2R(t-(2n+\tfrac{3}{2})T)\delta(t-(2n+\tfrac{3}{2})T) \quad (5)$$

The first equation (1) describes the analog baseband signal or stereo composite signal S(t). L(t) is the left-channel audio signal, R(t) is the right-signal audio signal, $\omega$ is the angular frequency of the pilot signal, $A_p$ is the amplitude of the pilot signal, and t is a continuous time variable. The first term on the right side is the left-right audio sum signal, the second term is the left-right audio difference signal as modulated onto the subcarrier, and the third term is the pilot signal.

The subcarrier has an angular frequency of 2ω. The pilot signal is thus transmitted in phase with the subcarrier signal, at half the subcarrier frequency. The pilot signal is needed to facilitate demodulation of the left-right difference signal, because the subcarrier frequency (38 kHz) is suppressed.

In the second and third equations (2) and (3), δ denotes the Dirac delta function, T=π/(2·ω), and the summation is over all integers n. The sine function in the second term of the first equation (1) takes on values of plus and minus one at non-zero values of the delta functions in equations (2) and (3). Multiplication of S(t) by P(t) in the fourth equation (4) is equivalent to selection of the samples to be stored in the first latch 7. Multiplication of S(t) by Q(t) in the fifth equation (5) is equivalent to selection of the samples to be stored in the second latch B. It can be seen that this selection yields data of the desired left-channel and right-channel audio signals.

For simplicity, the pilot signal has been ignored in equations (4) and (5), but even though a pilot component with alternate positive and negative values of magnitude $A_p/\sqrt{2}$ may appear in the latched data, this component is removed by the low-pass filters 9, 10.

The counting modulus of the phase counter 13 is predetermined according to the sampling clock frequency. If this frequency is substantially 152 kHz, for example, then the counting modulus is eight. The phase counter 13 counts up from zero to seven, incrementing once per sampling clock cycle, then wraps around from seven to zero. The repeating frequency of the counting process is substantially 152/8 kHz or 19 kHz, matching the pilot signal frequency. In this case, the cosine look-up table 12 stores only eight values, representing the cosine function in phase-angle steps of 45°. The value for phase angle 0° is output when the phase count output by the phase counter 13 is zero, and the other values are output in turn as the phase count increases.

The timings given by the delta function series in equation (2) then correspond to phase counts of one and five; input samples representing the left-channel audio signal are latched in the first latch 7 when the phase counter 13 reaches these two values. Similarly, the timings given by the delta function series in equation (3) correspond to phase counts of three and seven; input samples representing the right-channel audio signal are latched in the second latch 8 when the phase counter 13 reaches those two values.

The invented digital FM stereo demodulator employs the demodulation scheme described by the equations (1) to (5), and generates a digital phase error signal in the manner described above, but does not use the phase error signal to control a VCO. Instead, the invented digital FM stereo demodulator processes the input samples according to the digital phase error signal so as to extract or create internal samples having the necessary timing relationships to the pilot signal. It is thereby possible to dispense with the conventional digital-to-analog converter 101 and analog low-pass filter 102, simplifying the structure of the demodulator and reducing its manufacturing cost.

First Embodiment

Referring to FIG. 1, the first embodiment of the invention is a digital FM stereo demodulator comprising an analog-to-digital converter (ADC) 1, a digital signal processor (DSP) 2, and a master clock generator (MCLK) 3. The DSP 2 includes a decimator 4, a first variable-modulus counter 5, low-pass filters 6, 9, 10, 14, a first latch 7, a second latch B, a multiplier 11, a cosine look-up table 12, a phase counter 13, a modulus controller 15, and a second variable-modulus counter 16.

Although the internal components of the DSP 2 are shown as hardware blocks, some or all of these blocks may be replaced by software modules with equivalent functions. This remark also applies to the succeeding embodiments.

The master clock generator 3 generates a master clock signal with a fixed frequency. The master clock signal is supplied to the ADC 1 and DSP 2. The ADC 1 operates at a sampling frequency equal to the master clock frequency, generating input samples of the stereo composite baseband signal.

The first variable-modulus counter 5 counts cyclically up from zero with a first counting modulus controlled by the modulus controller 15 and second variable-modulus counter 16. Each time the first counting modulus is reached, an output pulse is generated and the count is reset to zero. The designated modulus value is selectable from, for example, a normal value N and values one greater than and one less than N, as indicated in the drawing. The normal value N is, for example, the ratio of the master clock frequency or input sampling frequency to the desired internal sampling frequency.

Each time the first variable-modulus counter 5 resets to zero, the decimator 4, multiplier 11, phase counter 13, and second variable-modulus counter 16 operate as described below.

The decimator 4 passes input samples received from the ADC 1 when the first variable-modulus counter 5 resets to zero as internal samples to low-pass filter 6 and the multiplier 11. Input samples received while the first variable-modulus counter 5 is counting up are discarded.

The phase counter 13 counts the pulses output by the first variable-modulus counter 5, thereby counting internal samples, and generates a phase count designating addresses in the cosine look-up table 12. The cosine look-up table 12 stores data for one complete cosine wave, the number of stored data values being equal to the number of internal samples normally output by the decimator 4 during one period of the pilot signal. This number is also the counting modulus of the phase counter 13. As the phase count cycles around, the cosine-wave data are read out repeatedly from the cosine look-up table 12 to generate a reference signal synchronized according to the internal sample timing. The multiplier 11 multiplies each internal sample value received from the decimator 4 by the reference-signal value read from the cosine look-up table 12. As in the prior art, the signal output by the multiplier 11 includes a low-frequency component substantially proportional to the phase difference between the reference signal and the pilot signal. Low-pass filter 14 extracts this low-frequency component, thereby generating a phase error signal.

The modulus controller 15 controls the first and second variable-modulus counters 5, 16 according to the phase error signal received from low-pass filter 14. Specifically, it sets the counting modulus M of the second variable-modulus counter 16, and sends the first variable-modulus counter 5 a signal indicating whether its normal counting modulus N is to be increased or decreased at times designated by the second variable-modulus counter 16.

The second variable-modulus counter 16 counts the pulses output by the first variable-modulus counter 5 according to the counting modulus M supplied by the modulus controller 15. At every M-th pulse, the second variable-modulus counter 16 resets its own count to zero and sends the first variable-modulus counter 5 a command to adjust its counting modulus N in the direction designated by the modulus controller 15.

Low-pass filter 6 removes unwanted high-frequency components from the decimated signal output by the decimator 4. The first and second latches 7, 8 store filtered sample values corresponding to predetermined phase counts output by the phase counter 13. Stereo audio data constituting the left-channel audio signal 2L and right-channel audio signal 2R are obtained by further low-pass filtering of the data stored in the latches 7, 8, this filtering being carried out by low-pass filters 9, 10.

By manipulating the first and second variable-modulus counters 5, 16, the modulus controller adjusts the decimation interval of the decimator 4 in response to the phase difference between the pilot signal and the reference signal. If the phase of the pilot signal leads the phase of the reference signal, the decimation interval is periodically shortened to advance the reference phase in relation to the pilot phase. If the phase of the pilot signal lags the phase of the reference signal, the decimation interval is periodically lengthened to retard the reference phase in relation to the pilot phase.

The operation of the first embodiment will be illustrated through a simple example, in which the cosine look-up table 12 stores eight values, representing one period of a cosine wave. Since the pilot frequency is 19 kHz, the desired internal sampling rate is 152 kHz (19×8=152). If the master clock frequency is 4.864 megahertz (4.864 MHz), the normal counting modulus N of the first variable-modulus counter 5 should be thirty-two (4864/152=32). That is, the decimation interval is normally thirty-two master clock cycles; the decimator 4 selects every thirty-second input sample as an internal sample. After filtering by low-pass filter 6, the internal sample values are stored in the first latch 7 when the phase count is one and five (corresponding to pilot phase angles of 45° and 225°), and in the second latch 8 when the phase count is three and seven (corresponding to pilot phase angles of 135° and 315°). Demodulated stereo audio data 2L, 2R are then obtained as described by equations (1) to (5) above.

If the modulus controller 15 sets the counting modulus M of the second variable-modulus counter 16 to thirty-one in this example, then it can adjust the internal sampling frequency and the reference signal frequency in steps of substantially one-tenth of one percent. Decreasing the first counting modulus from thirty-two (N) to thirty-one (N−1) once every M counting cycles (M=31) decreases the average decimation interval, and the average period of the reference signal, by a factor of (M−N−1)/(M−N) or 991/992, equivalent to a frequency increase of substantially 0.1%. Conversely, increasing the first counting modulus from thirty-two (N) to thirty-three (N+1) once every M counting cycles (M=31) increases the average decimation interval, and the average period of the reference signal, by a factor of (M·N+1)/(M·N) or 993/992, equivalent to a frequency decrease of substantially 0.1%.

By adjusting the frequency of the reference signal in this way, it is possible to advance or retard the phase of the reference signal until the reference signal, hence the internal sampling timing, is synchronized with the pilot signal.

In this example, the reference frequency was adjusted by adjusting the first counting modulus N by plus or minus one for just one counting cycle out of every M counting cycles, leaving M fixed, but the modulus controller 15 is not limited to this control scheme. The second counting modulus M may be adjusted instead of, or in addition to, the first counting modulus N. The first counting modulus N may also be adjusted in steps greater than plus or minus one, to reach synchronization with the pilot signal more quickly.

The accuracy of the phase adjustment performed in the first embodiment is limited by the master clock frequency. An unavoidable error of up to plus or minus one-half master clock period may arise with respect to the ideal timing given in equations (2) and (3). If the sampling frequency is 4.864 MHz, this error is ±103 ns, equivalent to approximately ±1.41° in terms of the phase of the 38-kHz FM stereo subcarrier wave, limiting stereo separation to approximately 70 dB. This timing error is inversely related to the master clock frequency, so a high master clock frequency and a high-speed ADC 1 are desirable for good stereo separation.

Much of the phase error indicated by the output of the third low-pass filter 14 is likely to arise from frequency error of the master clock oscillator 3, causing the master clock frequency not to be an exact integer multiple of the pilot frequency. Regular periodic adjustments of the phase of the reference signal, as enabled by the second variable-modulus counter 16, provide an appropriate remedy for this type of frequency error.

Provided the necessary high input sampling frequency is available, the first embodiment enables the internal sampling timing to be varied in small steps, producing minimal disturbance to the timing of other demodulation operations, hence minimal audio distortion. Moreover, decimation is a simple process, so the internal samples can be obtained from the input samples with a minimum of processing.

In a variation of the first embodiment, the second variable-modulus counter 16 is omitted, and the modulus controller 15 directly adjusts the counting modulus of the first variable-modulus counter 5 whenever the phase error exceeds a predetermined absolute value. This variation is suitable when the frequency error of the master clock oscillator 3 is small enough that regular periodic adjustment of the reference-signal phase is not necessary.

In another variation of the first embodiment, low-pass filter 6 is omitted. The main purpose of this filter is to reject input frequency components that might generate distortion in the audio range by aliasing when the decimated signal output from the decimator 4 is resampled at 38 kHz by the latches 7, 8. These frequency components occur between 61 kHz and 76 kHz. If these frequency components are absent in the input signal, or are already sufficiently small in the decimated signal, then low-pass filter 6 is not needed.

These variations also apply to the succeeding embodiments.

Second Embodiment

Figure 2:
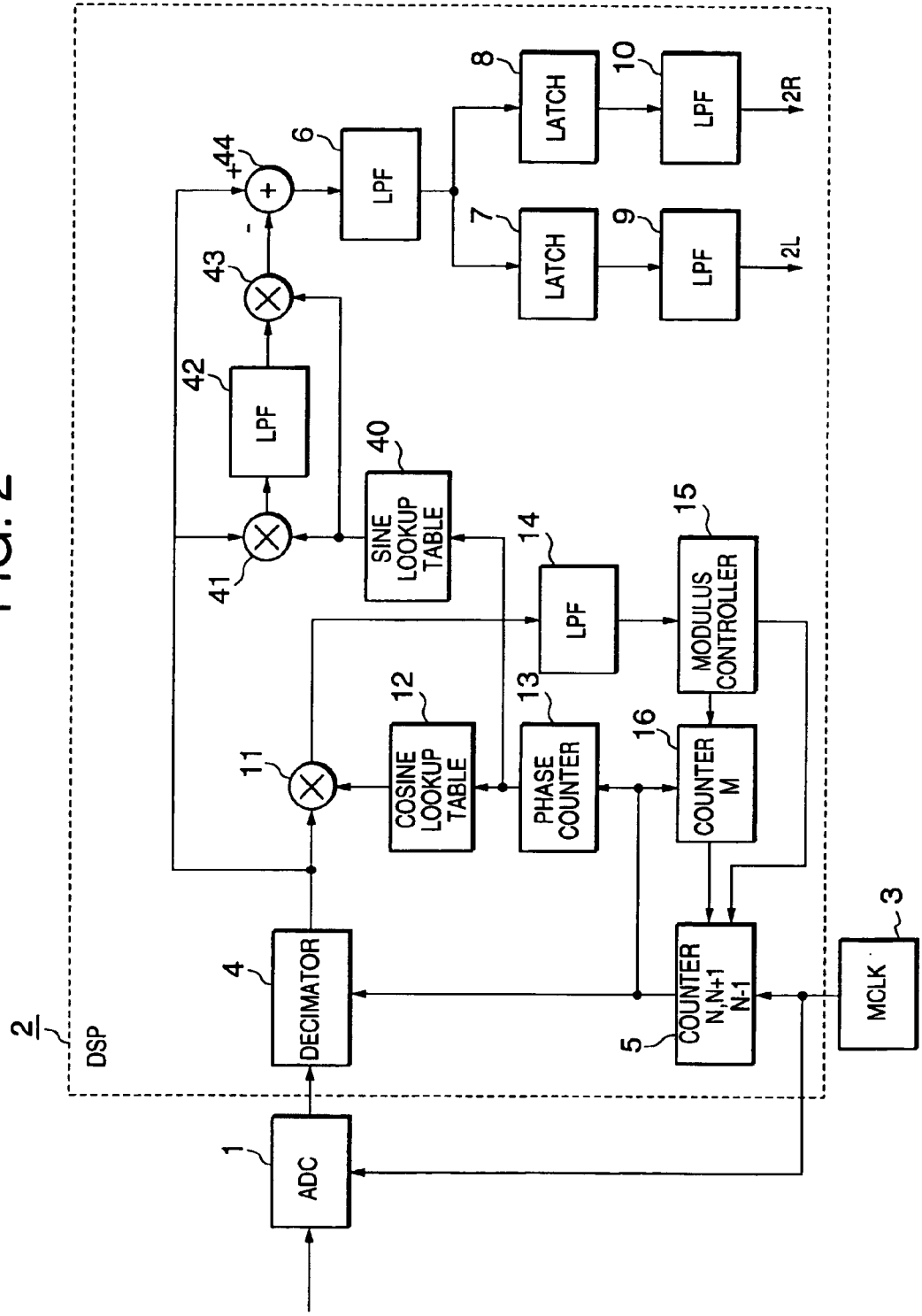
FIG. 2 is a block diagram of a digital FM stereo demodulator illustrating a second embodiment.

FIG. 2 shows a digital FM stereo demodulator illustrating a second embodiment of the invention. Descriptions of elements 1 to 16 will be omitted, as these elements are similar to the corresponding elements in the first embodiment. The additional elements in the second embodiment are a sine look-up table 40, a second multiplier 41, another low-pass filter 42, a third multiplier 43, and an adder 44.

Elements 1 to 16 operate as described in the first embodiment, synchronizing the internal sampling timing according to the pilot signal, and selecting suitable internal samples for the left-channel and right-channel stereo audio data.

The other elements detect the amplitude of the pilot signal, generate a replica of the pilot signal, and subtract the replica from the internal sample values before they undergo low-pass filtering and left-right channel selection. Cancellation of the pilot signal in this way relaxes the performance requirements of the first and second low-pass filters 9 and 10.

The sine look-up table 40 stores sine-wave data corresponding to the cosine-wave data stored in the cosine look-up table 12. Both tables are addressed by the output of the phase counter 13, so readout of the sine-wave data generates a sine-wave signal that is synchronized in phase with the reference signal. Since the reference signal is synchronized with the pilot signal, the sine-wave signal is also synchronized with the pilot signal, which is likewise a sine wave.

The second multiplier 41 multiplies the output of the decimator 4 by the sine-wave signal read from the sine look-up table 40. An envelope signal proportional to the amplitude of the pilot signal appears as a low-frequency component in the output of the second multiplier 41. Low-pass filter 42 extracts this low-frequency component, thereby detecting the amplitude of the pilot signal.

The third multiplier 43 multiplies the sine-wave signal read from the sine look-up table 40 by the amplitude detected by low-pass filter 42, thereby obtaining a pilot replica signal substantially identical to the pilot component included in the decimated stereo composite signal.

The adder 44 adds the two's complement of the output of the third multiplier 43 to the output of the decimator 4, thereby subtracting the pilot replica signal from the decimated composite stereo signal and substantially canceling the pilot-signal component out of the decimated stereo composite signal.

The performance requirements of the first and second low-pass filters 9, 10 are thereby greatly relaxed, because these filters do not have to reject a 19-kHz pilot component while passing audio components with frequencies up to, for example, 15 kHz. The structure of these two low-pass filters 9, 10 can accordingly be simplified, and the amount of filtering computation can be reduced.

In a variation of the second embodiment, the sine look-up table 40 is eliminated and the sine-wave signal is read from the cosine look-up table 12. This is possible because a sine wave is equivalent to a cosine wave with a 90° phase delay. It suffices to provide additional address inputs to the cosine look-up table, lagging the phase count output by the phase counter 13 by a predetermined amount.

Third Embodiment

Figure 3:
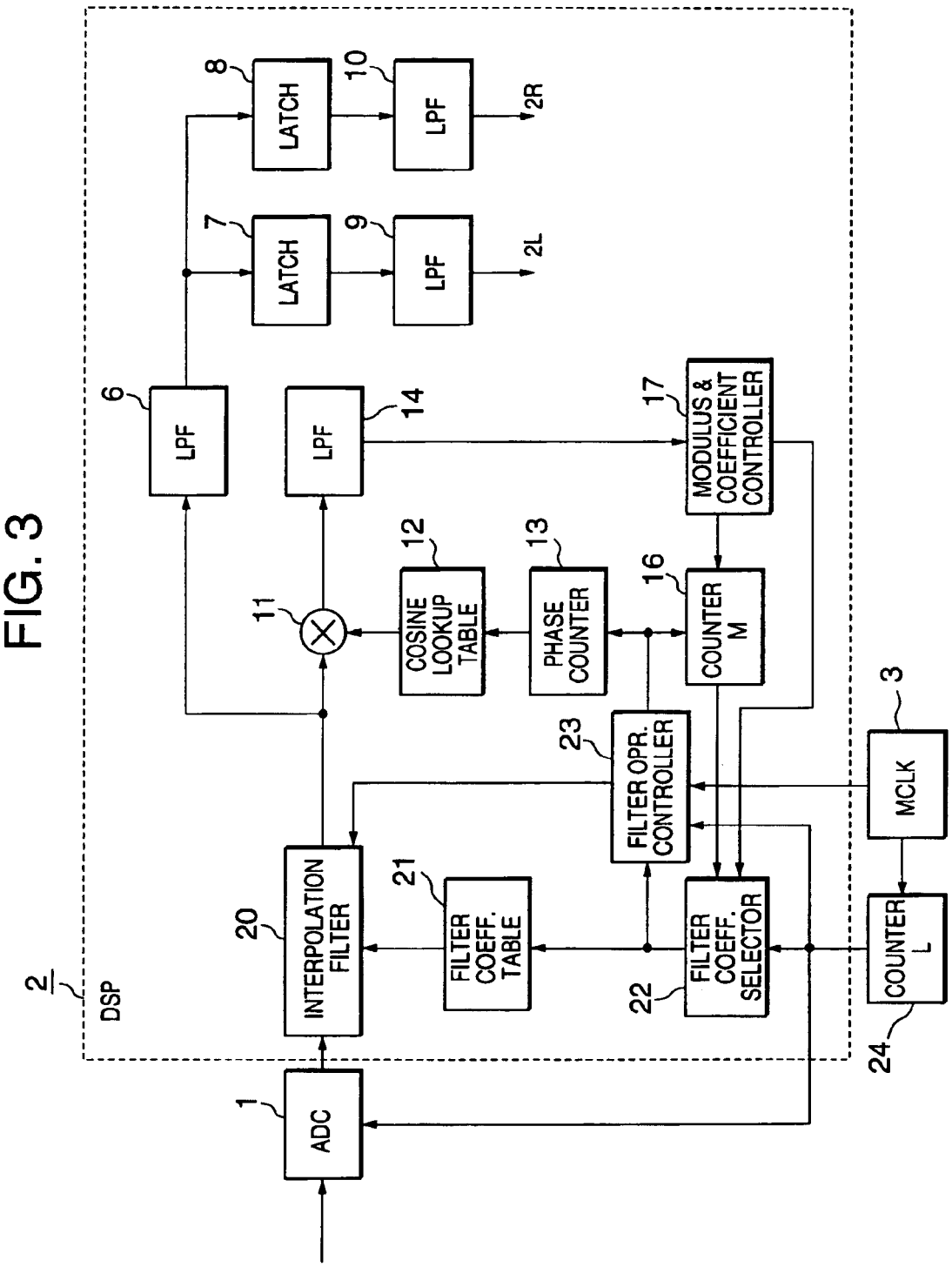
FIG. 3 is a block diagram of a digital FM stereo demodulator illustrating a third embodiment.

FIG. 3 shows a digital FM stereo demodulator illustrating a third embodiment of the invention. Descriptions of elements 1 to 3, 6 to 8, 9 to 14, and 16 will be omitted, as these elements are similar to the corresponding elements in the first embodiment. The new elements are a modulus and coefficient controller 17, an interpolation filter 20, a filter coefficient (Coeff.) table 21, a filter coefficient selector 22, a filter operation (Opr.) controller 23, and a clock frequency divider or counter 24.

The third embodiment uses the interpolation filter 20 to interpolate internal samples between the samples received from the ADC 1, varies the interpolation locations according to the phase error signal, and demodulates the interpolated sample data in place of the input sample data. The modulus and coefficient controller 17 designates the counting modulus of variable-modulus counter 16 as described in the first embodiment. The modulus and coefficient controller 17 also instructs the filter coefficient selector 22 whether to alter the filter coefficient selection (described below), and if so, in what direction to alter it.

Figure 4:
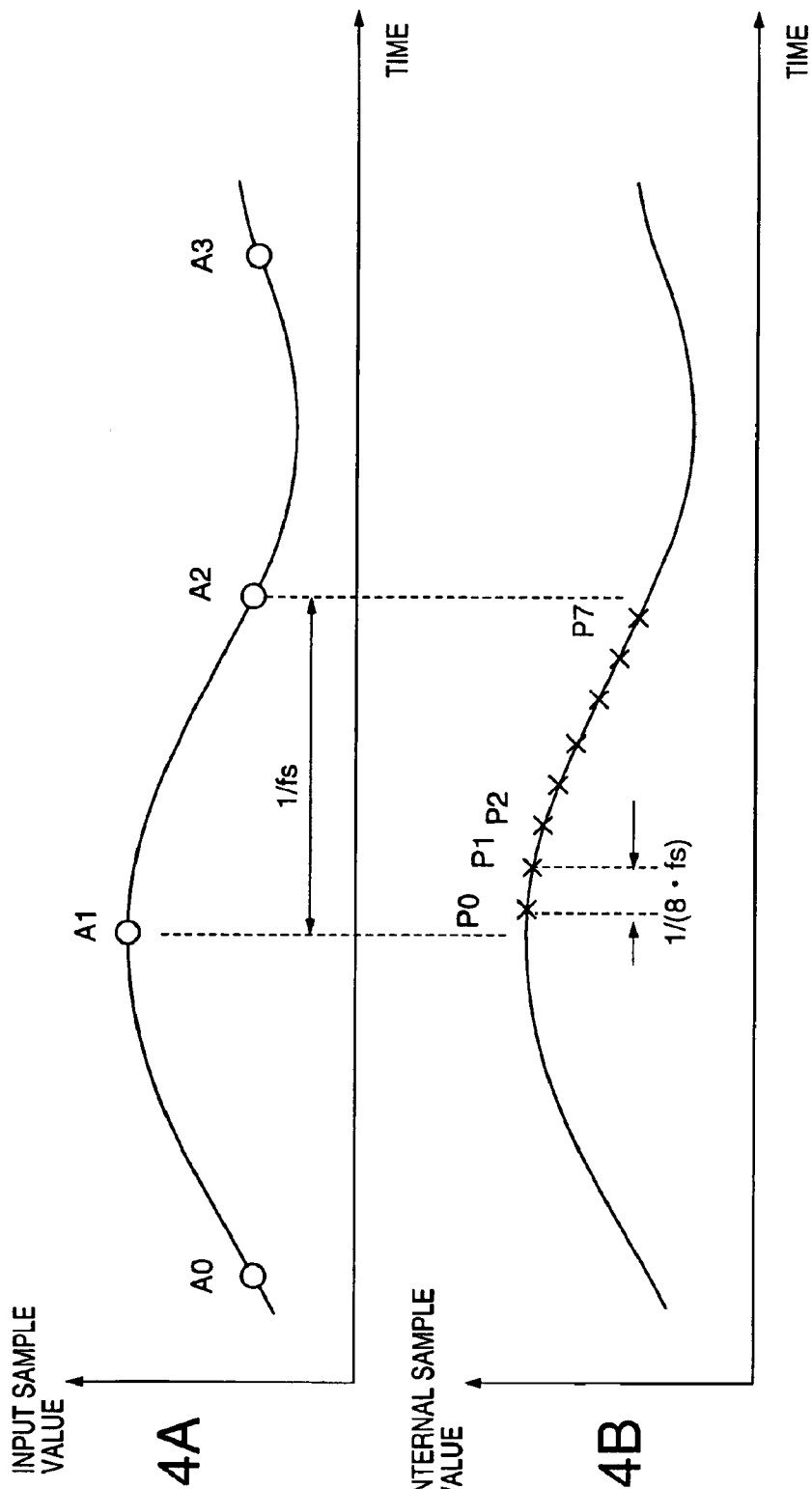
FIGS. 4A, 5A, 6A, and 7A show examples of input samples and in the third embodiment.
FIGS. 4B, 5B, 6B, and 7B show corresponding examples of internal samples in the third embodiment.

The interpolation filter 20 is, for example, a third-order finite-impulse-response (FIR) filter. Referring to FIGS. 4A and 4B, the interpolation filter 20 uses a set of, for example, four filter coefficients on four consecutive input samples A0, A1, A2, A3 received from the ADC 1 to interpolate an internal sample at a certain temporal distance from the most recently received input sample A3. The internal sample can be interpolated at one of, for example, eight points P0 to P7 positioned in an interval of length 1/fs between input samples A1 and A2 on the time axis, where fs is the input sampling frequency. The eight points are mutually separated by intervals of $1/(8 \cdot fs)$. P0 is farthest from the most recent input sample A3, and P7 is closest to the most recent input sample A3. An interpolated sample is normally output at only one of these points P0 to P7, the point depending on the filter coefficients used. The interpolated sample or internal sample is supplied to low-pass filter 6 and multiplier 11.

The filter coefficient table 21 stores, for example, eight sets of four coefficients each, for generating data at respective points P0 to P7 in FIG. 4B. The coefficient sets are numbered from zero to seven, corresponding to P0 to P7. These numbers will be referred to as filter numbers below.

The invention is of course not limited to the use of eight sets of four coefficients each. The number of coefficient sets may be increased, providing more possible locations for the interpolated samples, to permit increased synchronization accuracy. The number of coefficients in each set may also be increased, thereby increasing the FIR filter order, to improve the accuracy of interpolation. However, eight sets of four coefficients each will be assumed for descriptive purposes for the time being.

The filter coefficient selector 22 selects one of the sets of coefficients in the filter coefficient table 21 and transfers the selected coefficients to the interpolation filter 20, if they differ from the coefficients already being used by the interpolation filter 20, thereby updating the coefficients in the interpolation filter 20. Updates may be made each time variable-modulus counter 16 resets to zero. The new selection is either the same as the previous selection, or adjacent in the increasing or decreasing direction, as designated by the modulus and coefficient controller 17. That is, the filter number either remains the same, increases by one, or decreases by one. In the increasing direction, the filter number wraps around from seven to zero. In the decreasing direction, the filter number wraps around from zero to seven.

Operating according to the outputs of the master clock oscillator 3, filter coefficient selector 22, and counter 24, the filter operation controller 23 periodically activates the interpolation filter 20, and simultaneously outputs a pulse that is counted by the phase counter 13 and variable-modulus counter 16. These counters 13, 16 accordingly count the internal samples output from the interpolation filter 20.

The counter 24 divides the frequency of the master clock signal by a fixed factor L, and supplies the divided clock signal to the ADC 1, filter coefficient selector 22, and filter operation controller 23. The divided clock frequency becomes the sampling frequency (fs) of the ADC 1.

Low-pass filters 6, 9, 10 and latches 7, 8 operate as described in the first embodiment to generate stereo audio data comprising a left-channel audio signal 2L and a right-channel audio signal 2R from the internal samples output from the interpolation filter 20. Multiplier 11, cosine look-up table 12, phase counter 13, and low-pass filter 14 also operate as in the first embodiment to generate a phase error signal from the internal samples.

By controlling the variable-modulus counter 16 and filter coefficient selector 22, the modulus and coefficient controller 17 adjusts the spacing of the internal samples output by the interpolation filter 20 in much the same way that the decimation interval was adjusted in the first embodiment. This has the effect of adjusting the phase relationship between the pilot signal and the reference signal read out from the cosine look-up table 12, as explained in the first embodiment. The modulus and coefficient controller 17 operates according to the phase error signal received from low-pass filter 14 so as to synchronize the reference signal with the pilot signal, thereby synchronizing the internal sampling timing with the pilot signal, as also explained in the first embodiment.

Figure 5:
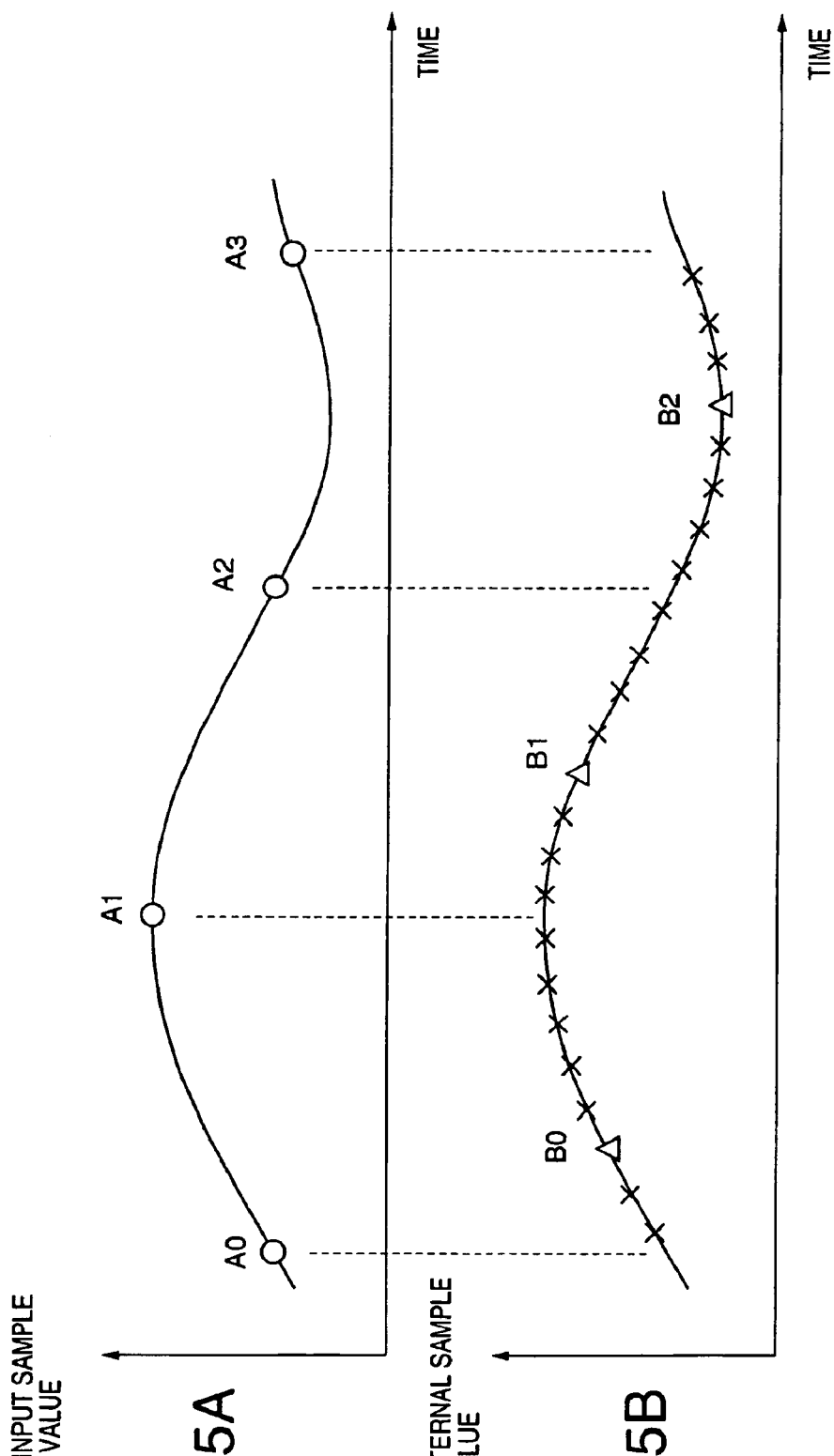

As one example, the modulus and coefficient controller 17 may cause the filter number to increase progressively as shown in FIGS. 5A and 5B. Internal sample B0 is generated by interpolation from input samples A(−1) (not visible) to A2, using filter number two. Internal sample B1 is generated from input samples A0 to A3, using filter number three. Internal sample B2 is generated from input samples A1 to A4 (not visible), using filter number four. Compared with the intervals between input samples, the intervals between internal samples are lengthened, reducing the internal sampling frequency, thereby retarding the phase of the reference signal.

Figure 6:
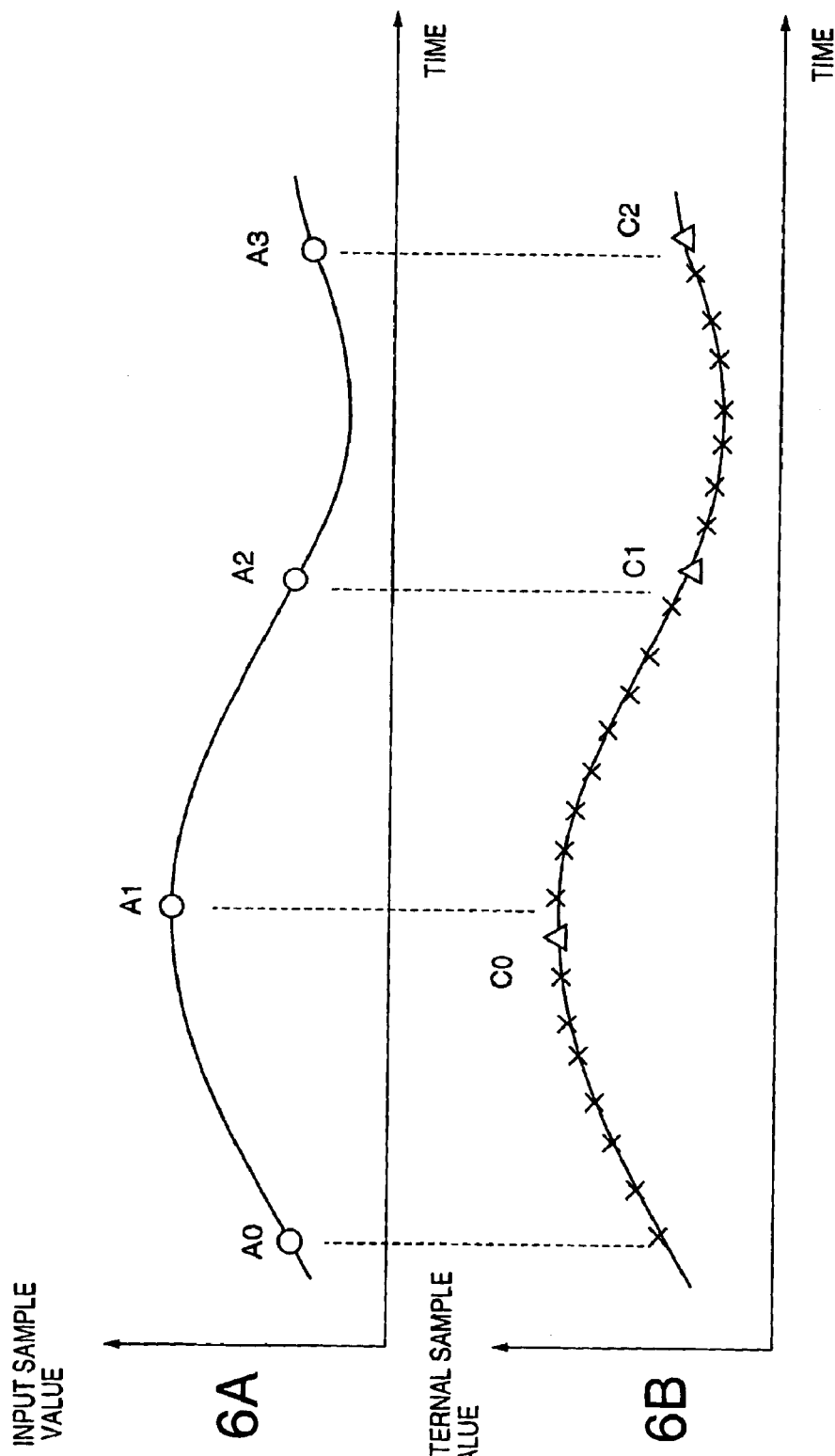

In this situation, since more samples are input to the interpolation filter 20 than are output from it, the interpolation filter 20 cannot generate an internal sample for every input sample. The filter operation controller 23 accordingly skips one input sample each time the filter number wraps around in the increasing direction. In FIGS. 6A and 6B, for example, after internal sample C0 is generated using filter number seven, which places the interpolated internal sample as close as possible to the current input sample A2, the filter number is changed from seven to zero. The filter operation controller 23 responds by skipping the following input sample A3. The next internal sample C1 is generated when input sample A4 (not visible) is received, using filter number zero. Since this filter selection interpolates the internal sample (C1) as far as possible from the current input sample (A4), the desired interval between consecutive internal samples C0 and C1 is obtained.

Figure 7:
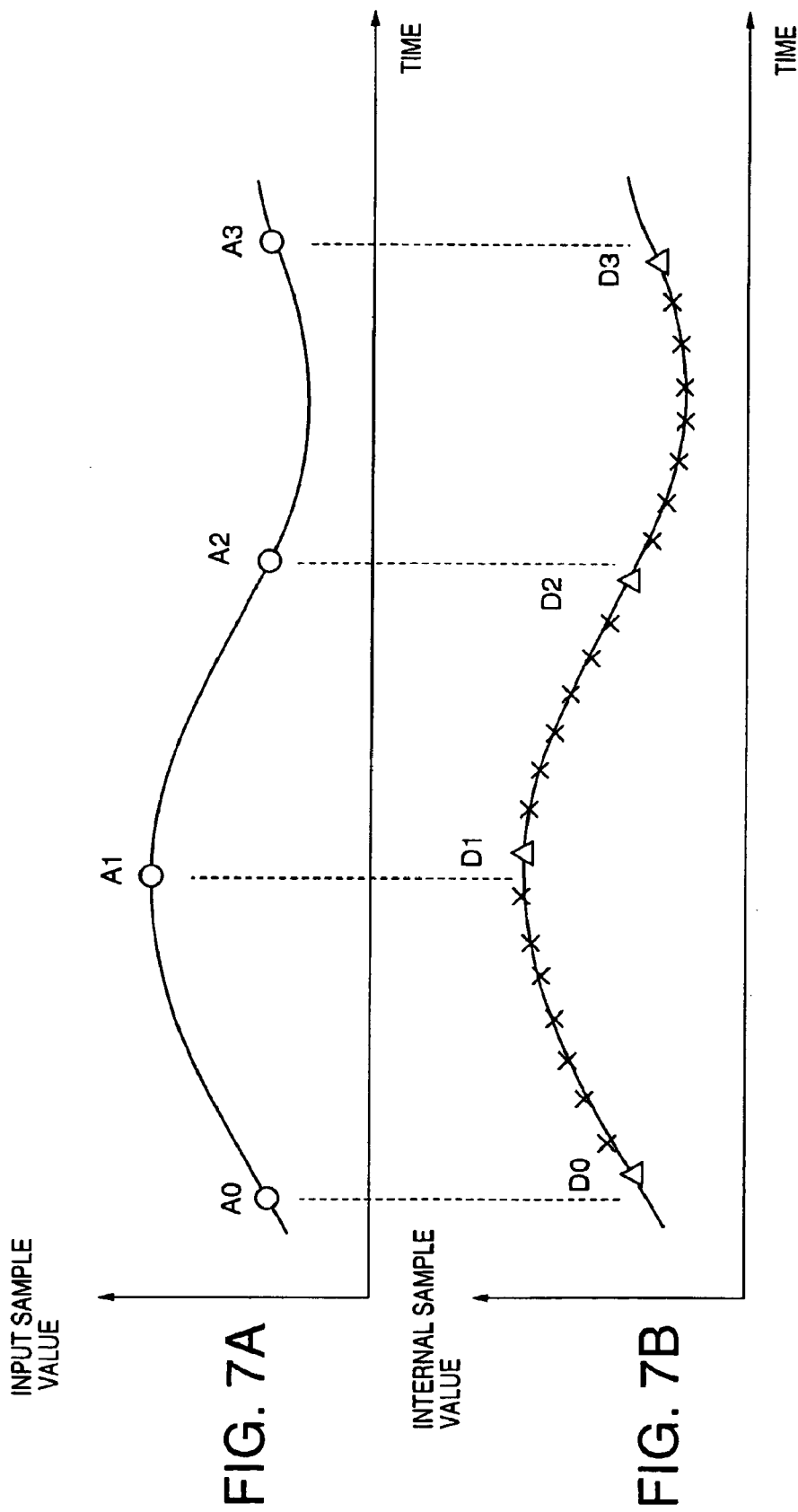

In the reverse situation, when the filter number wraps around in the decreasing direction from zero to seven, the filter operation controller 23 activates the interpolation filter 20 twice for the same input sample, once using the old filter number and once using the new filter number, to compensate for a deficiency of input samples. In FIGS. 7A and 7B, for example, internal sample D0 is generated when input sample A2 is received, using filter number zero. The filter coefficient selector 22 then notifies the filter operation controller 23 that the filter selection will be changed from zero to seven. When the next input sample A3 is received, first the filter operation controller 23 activates the interpolation filter 20, which generates internal sample D1, again using filter number zero; next, the filter coefficient selector 22 transfers the coefficients for filter number seven into the interpolation filter 20; then the filter operation controller 23 again activates the interpolation filter 20, which generates internal sample D2. Both internal samples D1 and D2 are generated from the same input sample data (A0 to A3), but since D1 is as far as possible from the current input sample (A3) and D2 is as close as possible to the current input sample (A3), the desired interval between internal samples is obtained.

The filter operation controller 23 delays activation of the interpolation filter 20 by a certain number of master clock cycles from each divided pulse output by the clock frequency divider 24, to allow time for the ADC 1 to complete analog-to-digital conversion. This delay may be fixed, but is preferably varied according to the filter number, so that the interpolation filter 20 can operate at substantially regular intervals.

Figure 8:
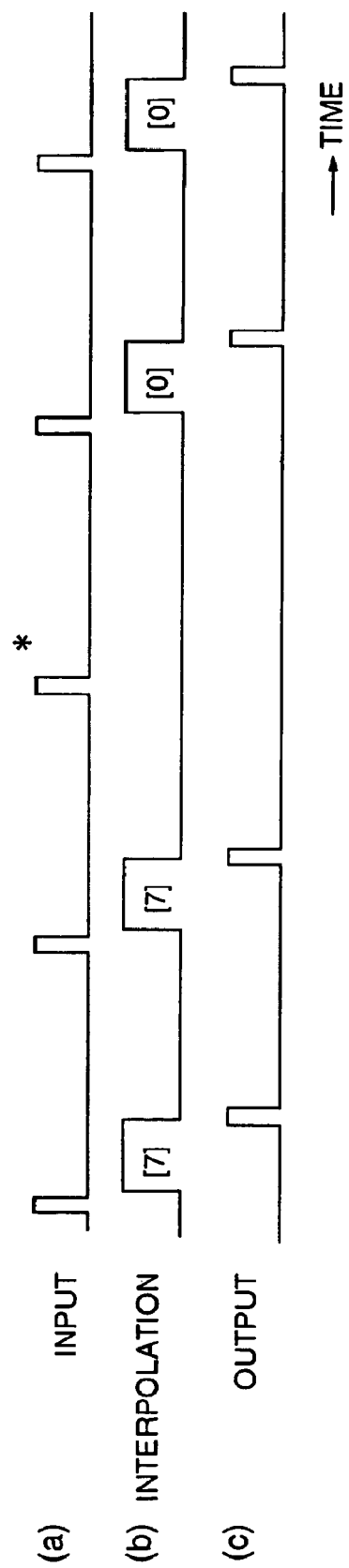
FIGS. 8, 9, 10, and 11 are timing diagrams showing examples of the timing of interpolation operations in the third embodiment.
Figure 9:
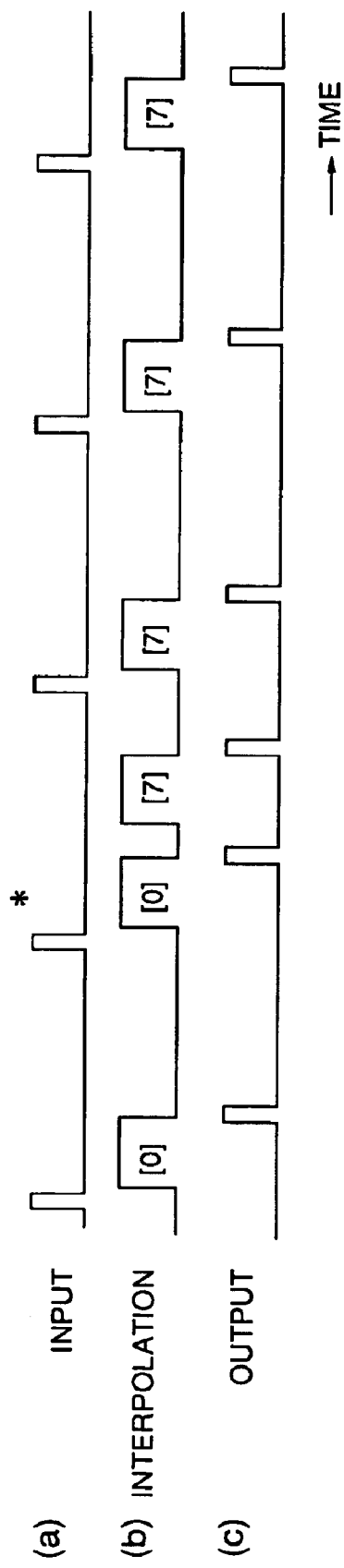

FIGS. 8 and 9 show the timing relationships of sample input (a) to the interpolation filter 20, interpolation processing (b), and output of internal samples (c) when the interpolation filter 20 is activated at a fixed timing delay from the divided clock signal. The delay is predetermined so that the interpolation filter 20 normally begins processing just after it receives each input sample.

FIG. 8 illustrates a case in which the filter number (indicated in brackets) wraps around from seven to zero and the interpolation operation for the input sample marked with an asterisk is skipped. This produces a doubly wide interval between two internal samples.

FIG. 9 illustrates a case in which the filter number wraps around from zero to seven, causing output of two internal samples for the input sample indicated by an asterisk. The interval between internal samples is reduced by half at this point.

These timing variations are permissible if they do not affect the quality of the final audio output, but adverse effects are possible if the variations are not absorbed in subsequent stages of the demodulation process. Furthermore, in FIG. 9, the interpolation filter must operate fast enough to complete two interpolation computations in the interval between one pair of input samples; this requirement either constrains the complexity, hence accuracy, of the interpolation filtering computation, or requires a high-speed, therefore expensive, DSP 2.

Figure 10:
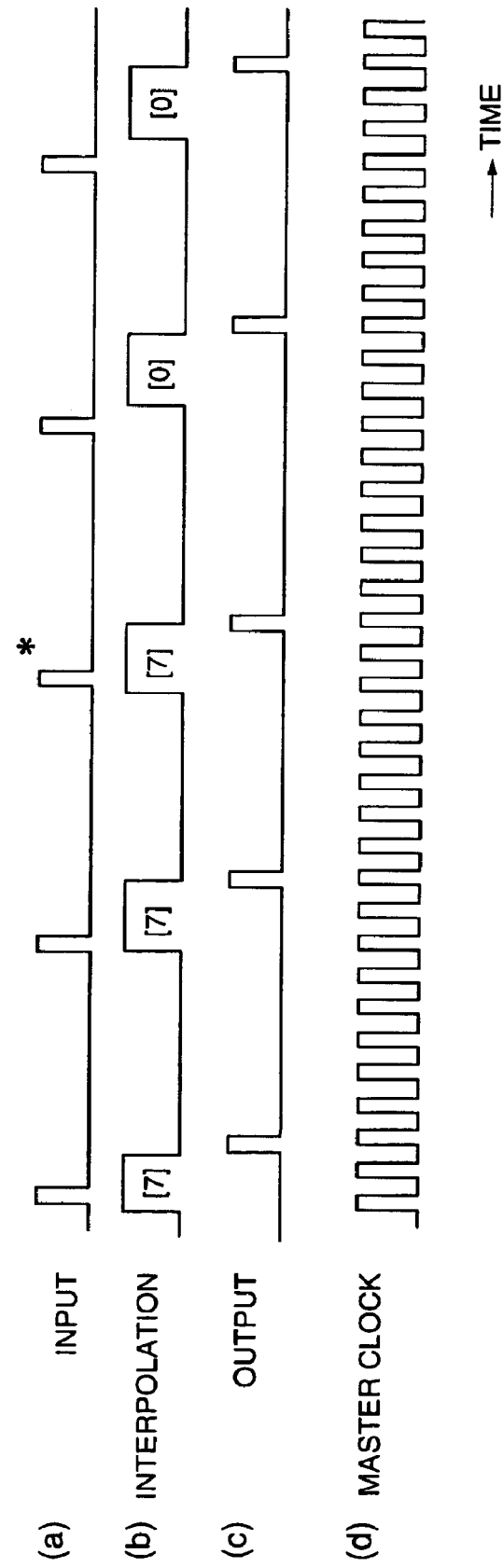
Figure 11:
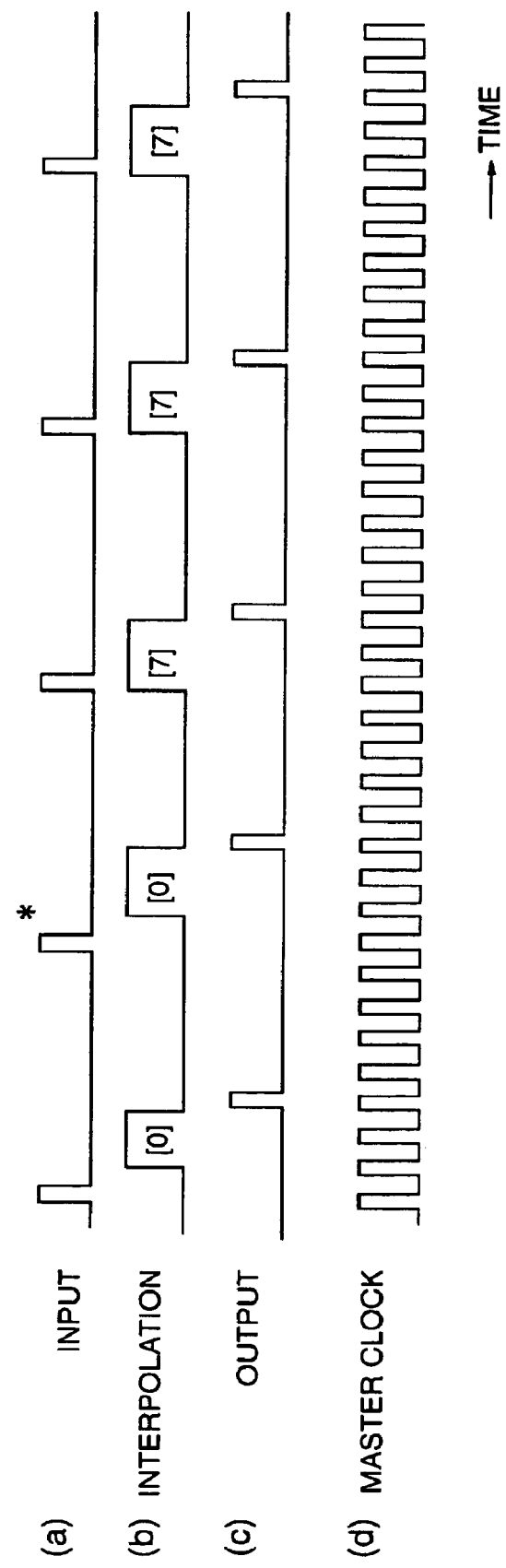

FIGS. 10 and 11 show the timing relationships of sample input (a) to the interpolation filter 20, interpolation processing (b), output of internal samples (c), and the master clock (d) when the interpolation filter 20 is activated at a variable timing delay from the divided clock signal. The delay increases with the filter number, thus increasing as the temporal distance from the most recent input sample to the interpolation point decreases. When filter number zero is selected, the filtering process begins just after reception of the most recent input sample. When filter number seven is selected, the start of the filtering process is delayed until just before the next input sample is received. The filter operation controller 23 produces these variable delays by counting a variable number of master clock cycles from each divided clock pulse, according to the filter number reported by the filter coefficient selector 22.

In FIG. 10, the filter number wraps around from seven to zero, causing interpolation for the input sample indicated by an asterisk to be skipped. In FIG. 11, the filter number wraps around from zero to seven, and the interpolation filter 20 is activated twice following input of the input sample marked with the asterisk. In both cases, because of the variable delay, the timing interval between the output of successive internal samples changes only slightly. Ample time is available for every interpolation operation, and the audio output is not distorted by irregular timing of the output of the internal samples.

An advantage of the third embodiment is that the ADC 1 can operate at substantially the desired internal sampling frequency, instead of a higher frequency. If the desired sampling frequency is 152 kHz, for example, and the number of sets of filter coefficients is thirty-two, then the third embodiment enables the reference signal to be synchronized with the pilot signal with substantially the same precision as achieved in the first embodiment using a 4.864-MHz ADC 1 and a decimation interval of thirty-two, (although interpolation error may reduce the actual precision somewhat).

If the number of sets of filter coefficients is N, the average internal sampling frequency can be increased by a factor of M·N/(M·N−1) by reducing the filter number, thereby retarding the interpolation point, once every M samples. Conversely, the average internal sampling frequency can be decreased by a factor of M·N/(M·N+1) by increasing the filter number, thereby advancing the interpolation point, once every M samples.

In a variation of the third embodiment, the filter operation controller 23 normally activates the interpolation filter 20 only at intervals of two or more input samples, so that the interpolation filter 20 performs both decimation and interpolation. For example, only the even-numbered internal samples in FIGS. 5 to 7 may be output: B0, B2, . . . in FIG. 5B, C0, C2, . . . in FIG. 6B, and D0, D2, . . . in FIG. 7B. This variation can be used to obtain a desired internal sampling frequency when the input sampling frequency is higher than necessary for stereo demodulation.

Fourth Embodiment

Figure 12:
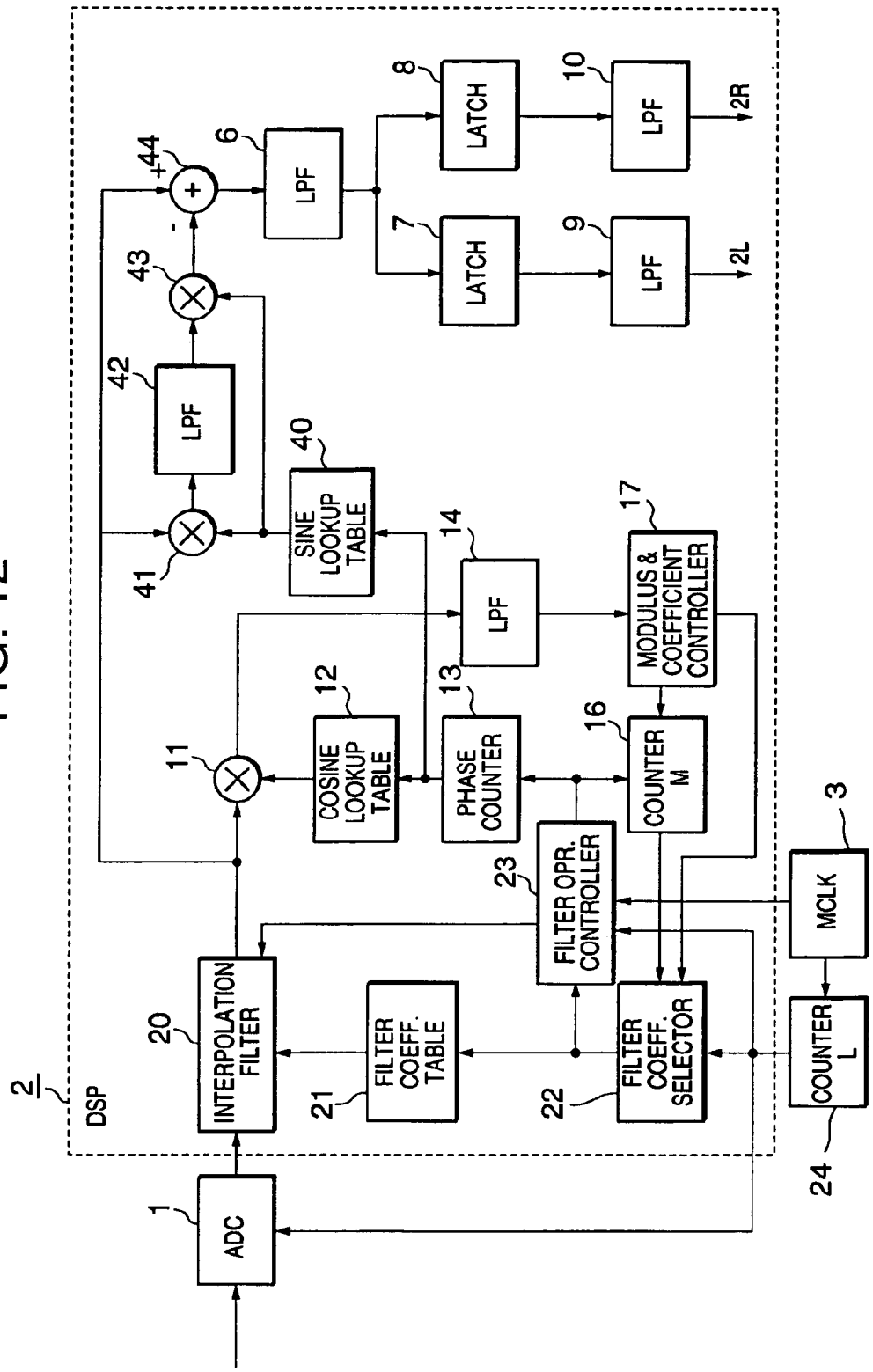
FIG. 12 is a block diagram of a digital FM stereo demodulator illustrating a fourth embodiment.

FIG. 12 shows a digital FM stereo demodulator illustrating a fourth embodiment of the invention. A detailed description will be omitted, because all of the illustrated elements are identical to the corresponding elements in the second and third embodiments, and operate in the same way. The fourth embodiment adds the pilot cancellation function of the second embodiment to the interpolation function of the third embodiment, obtaining the combined effects of both embodiments.

Fifth Embodiment

Figure 13:
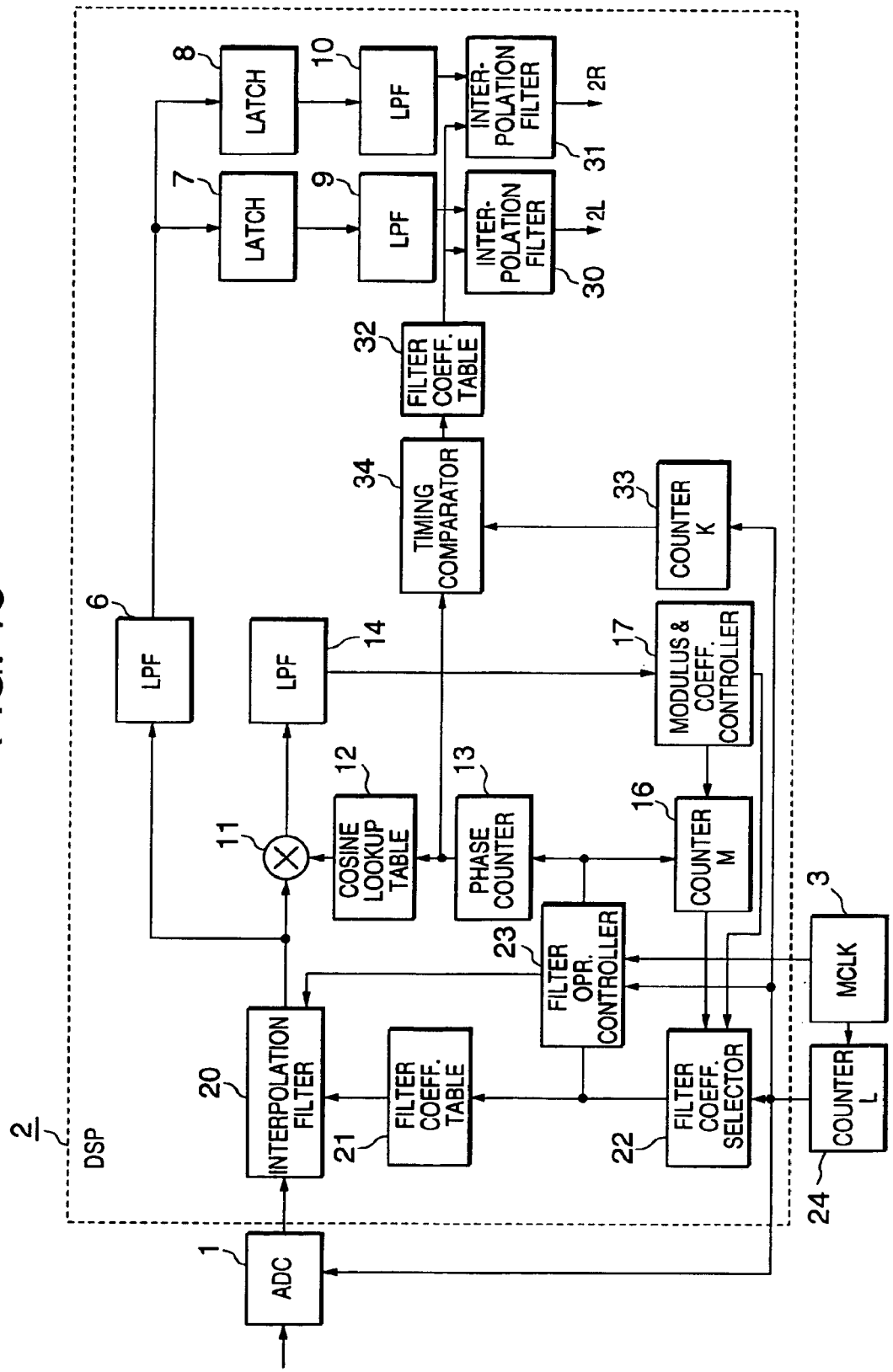
FIG. 13 is a block diagram of a digital FM stereo demodulator illustrating a fifth embodiment.

FIG. 13 shows a digital FM stereo demodulator illustrating a fifth embodiment of the invention. Descriptions of elements 1 to 3, 7 to 14, 16, 17, and 20 to 24 will be omitted, as these elements are similar to the corresponding elements in the first and third embodiments. The new elements are a second interpolation filter 30, a third interpolation filter 31, a second filter coefficient table 32, an audio output timing counter 33, and a timing comparator 34.

The two new interpolation filters 30, 31 are, for example, third-order FIR filters similar to interpolation filter 20. Interpolation filter 30 receives the data output from low-pass filter 9, and outputs interpolated data as the left-channel audio data signal 2L. Interpolation filter 31 operates similarly on the output of low-pass filter 10, generating the right-channel audio data signal 2R.

The second filter coefficient table 32 stores a plurality of sets of filter coefficients for selective transfer into these interpolation filters 30, 31.

The audio output timing counter 33 counts the divided clock signal output by the counter 24 using, for example, the same counting modulus (K) as used by the phase counter 13.

The timing comparator 34 compares the timing of transitions in the outputs of the phase counter 13 and audio output timing counter 33, and selects the set of coefficients to be transferred from the second filter coefficient table 32 into interpolation filters 30, 31.

Elements 1 to 23 operate as described in the third embodiment, performing interpolation at points synchronized with the pilot signal to generate internal samples, latching selected internal samples as left-channel and right-channel audio data, and passing the latched data through low-pass filters 9, 10. Interpolation filters 30 and 31 are activated in synchronization with the divided clock signal output by the counter 24, and therefore generate stereo audio output data at regular intervals.

Figures 14A, 14B:
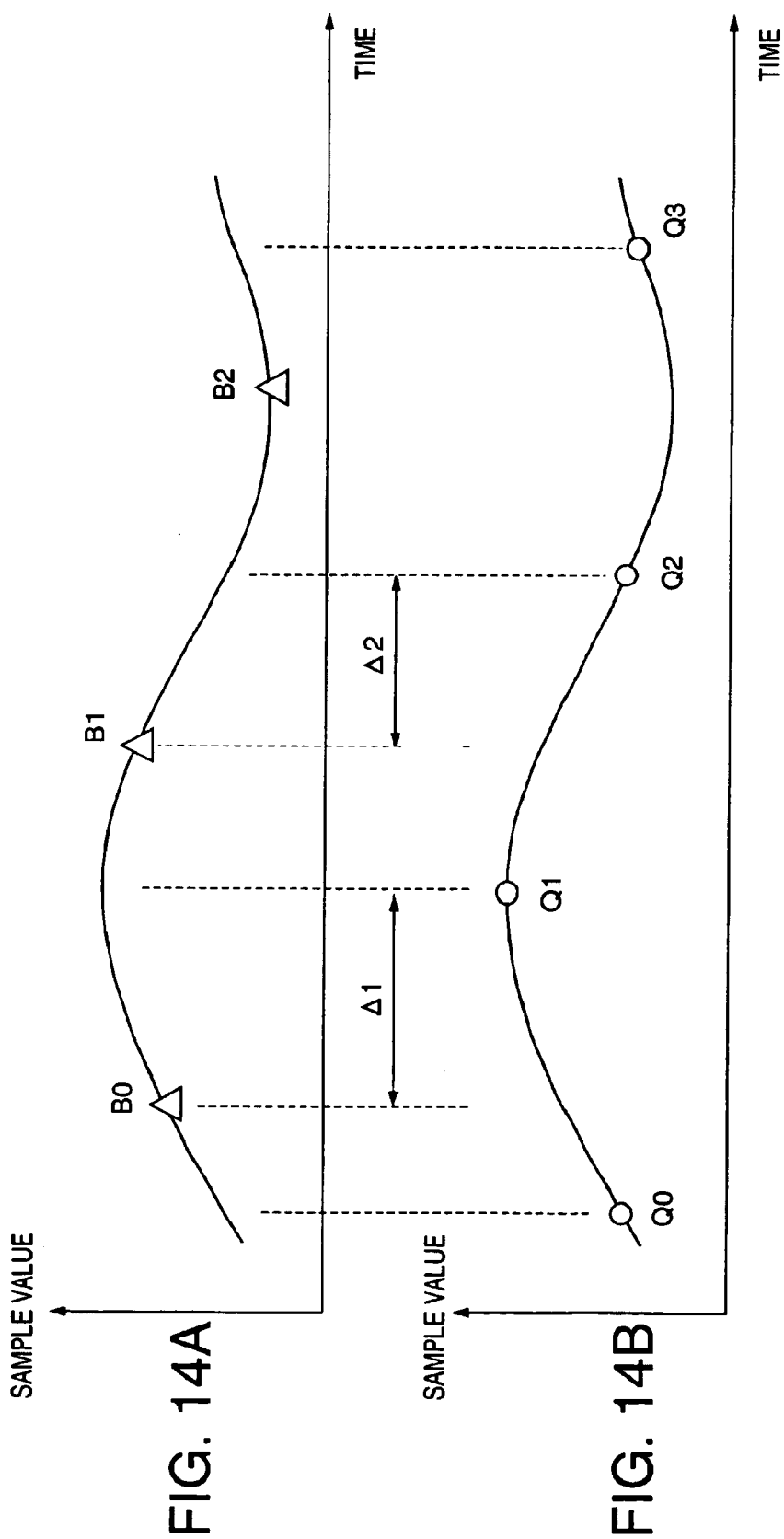

Referring to FIGS. 14A and 14B, the timing comparator 34 measures timing differences such as Δ1 and Δ2 between the input of data B0, B1, ... to interpolation filter 30 or 31, detected from the phase count output by the phase counter 13, and the output of final audio data Q0, Q1, ... from the same interpolation filter 30 or 31, detected from the output of the audio output timing counter 33. On the basis of these differences, the timing comparator 34 selects the filter coefficients to be loaded into the interpolation filters 30 and 31.

As explained in the third embodiment, the timing of internal sample output from interpolator 20 is not perfectly regular, but varies with respect to the divided clock signal. By selecting different sets of filter coefficients, the timing comparator 34 compensates for the variations so that interpolation filters 30, 31 can produce correct audio output data at regularly spaced intervals.

As in the third embodiment, special provisions are required when, due to the above timing variations, there is an excess or deficiency of input data to interpolation filters.

Figures 15A, 15B:
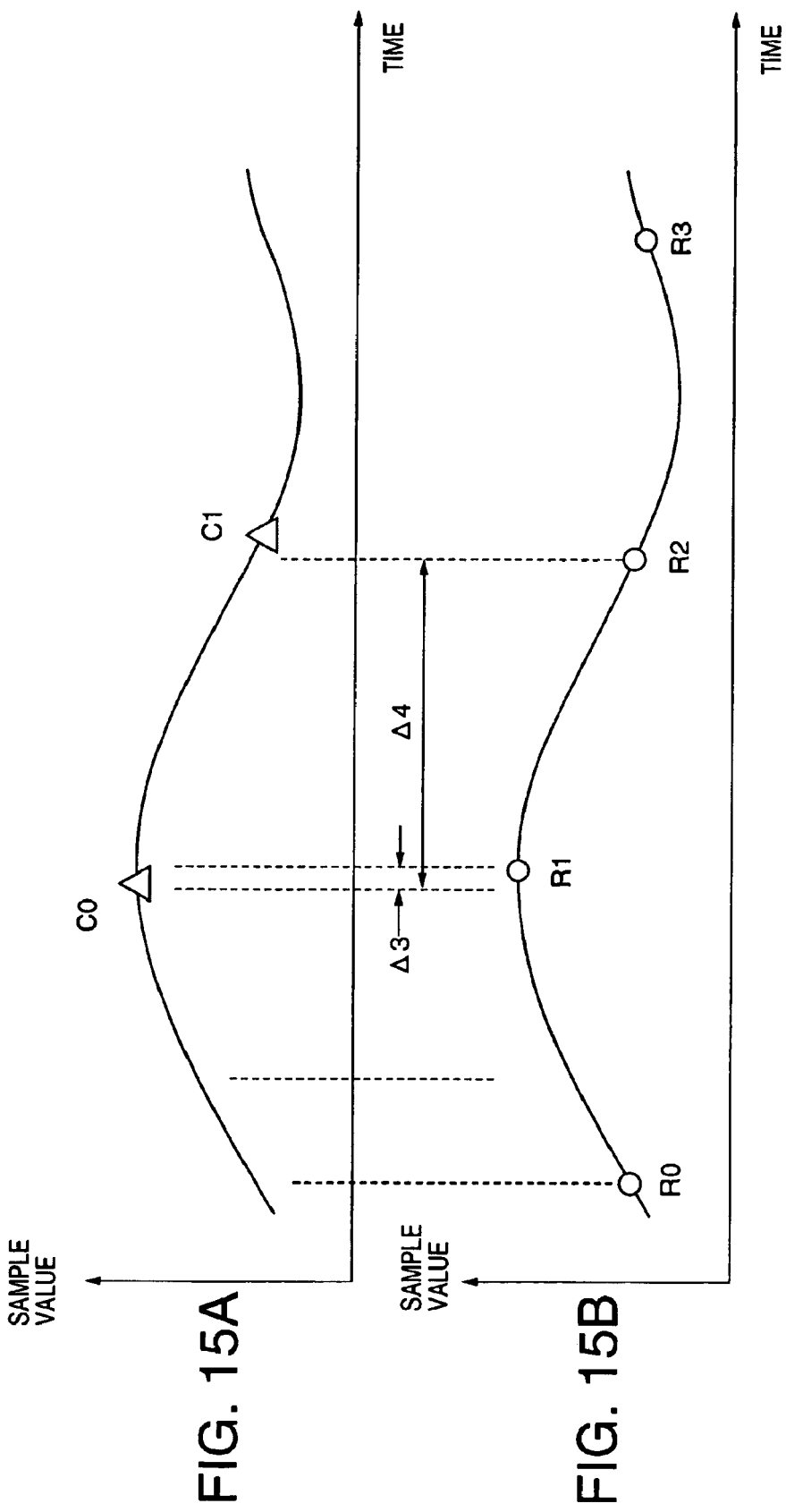

FIGS. 15A and 15B show a case in which data values C0 and C1 are input to interpolation filter 30 or 31, and audio data values R0 to R3 are output from the same interpolation filter 30 or 31, with both R1 and R2 occurring between C0 and C1, causing a deficiency of input data at this point. In this case, R1 is generated using filter coefficients selected on the basis of the timing difference Δ3 with respect to the C0, and R2 is generated from the same input data, using different filter coefficients selected on the basis of the timing difference Δ4 with respect to the same input data value C0.

FIGS. 16A and 16B show a case in which data values D0 to D3 are input to interpolation filter 30 or 31, and audio data values S0 to S3 are output from the same interpolation filter 30 or 31, with no output data occurring between input data D1 and D2, causing an excess of input data at this point. In this case, interpolation is not performed on the input data set consisting of the four values D0 to D3, corresponding to timing difference Δ5. S2 is generated from input data D1 to D4 (not visible), using filter coefficients selected according to the next timing difference Δ6.

The fifth embodiment converts the left-channel and right-channel audio data to data series spaced at exactly regular intervals generated by division of the master clock signal. This allows the stereo audio data to be converted to analog signals by digital-to-analog converters (not visible) of, for example, the delta-sigma type or one-bit type, which require data input at regular intervals, synchronized with a clock signal.

A digital-to-analog converter of the one-bit type combines high precision with a simple structure and low cost, and is comparatively easy to integrate with digital signal-processing circuits. By enabling this type of digital-to-analog converter to be used, the fifth embodiment reduces manufacturing costs, and enables the analog audio output section to be combined with the digital FM stereo demodulator in a single monolithic integrated circuit.

In a variation of the fifth embodiment, a pilot signal cancellation function is added as in the second and fourth embodiments.

Any of the foregoing embodiments can be modified by replacing the analog-to-digital converter 1 with some other means of generating a digitized stereo composite baseband signal having an equivalent sampling frequency. For example, the stereo composite baseband signal may be output from a digital FM demodulator.

Those skilled in the art will recognize that further modifications are possible within the scope claimed below.

What is claimed is:

1. A method of demodulating a stereo composite signal including a pilot signal, comprising the steps of:
    (a) sampling the stereo composite signal at a fixed sampling frequency to obtain input samples;
    (b) processing the input samples to obtain internal samples having variable sampling timings;
    (c) generating a reference signal according to the variable sampling timings;
    (d) detecting a phase difference between the pilot signal and the reference signal using the internal samples;
    (e) varying the variable sampling timings according to the detected phase difference; and
    (f) digitally processing the internal samples to obtain stereo audio data.

2. The method of claim 1, wherein said step (b) comprises decimating the input samples with a variable decimation interval, and said step (e) comprises varying the decimation interval.

3. The method of claim 1, wherein said step (b) comprises using filter coefficients to perform an interpolation process on the input samples, the internal samples thus being obtained by interpolation, and said step (e) comprises changing the filter coefficients.

4. The method of claim 3, wherein:
    said step (e) further comprises selecting the filter coefficients from a plurality of sets of filter coefficients yielding internal samples interpolated at different temporal distances from a most recent input sample, the plurality of sets including at least a first set of filter coefficients interpolating an internal sample at a shortest of said temporal distances from the most recent input sample, and a second set of filter coefficients interpolating an internal sample at a longest of said temporal distances from the most recent sample.

5. The method of claim 4, wherein said step (b) further comprises the steps of:
    skipping generation of an internal sample for the most recent input sample when the filter coefficients are changed from the first set to the second set; and
    generating two internal samples for the most recent input sample, using both the first set of filter coefficients and the second set of filter coefficients, when the filter coefficients are changed from the second set to the first set.

6. The method of claim 4, wherein said step (b) further comprises the step of delaying starting timings of the interpolation process according to said temporal distances from the most recent input sample.

7. The method of claim 1, wherein said step (f) comprises performing an interpolation process on the internal samples, thereby generating the stereo audio data at regular intervals.

8. The method of claim 1, wherein said step (f) comprises generating a pilot replica signal from the internal samples, and subtracting the pilot replica signal from the internal samples to cancel the pilot signal.

9. A digital FM stereo demodulator for demodulating a stereo composite signal including a pilot, signal comprising:
  means for obtaining input samples of the stereo composite signal, the input samples being sampled at a fixed sampling frequency;
  means for processing the input samples to obtain internal samples having variable sampling timings;
  means for generating a reference signal according to the variable sampling timings;
  means for detecting a phase difference between the pilot signal and the reference signal using the internal samples;
  means for varying the variable sampling timings according to the detected phase difference; and
  means for digitally processing the internal samples to obtain stereo audio data.

10. The digital FM stereo demodulator of claim 9, wherein said means for processing comprises a decimator decimating the input samples with a variable decimation interval, and said means for varying varies the decimation interval.

11. The digital FM stereo demodulator of claim 9, wherein said means for processing comprises an interpolation filter using filter coefficients to perform an interpolation process on the input samples, the internal samples thus being obtained by interpolation, and said means for varying changes the filter coefficients.

12. The digital FM stereo demodulator of claim 11, further comprising a filter coefficient table storing a plurality of sets of filter coefficients yielding interpolated samples interpolated at different temporal distances from a most recent input sample, the plurality of sets including at least a first set of filter coefficients interpolating an internal sample at a shortest of said temporal distances from the most recent input sample, and a second set of filter coefficients interpolating an internal sample at a longest of said temporal distances from the most recent sample.

13. The digital FM stereo demodulator of claim 12, further comprising a filter operation controller activating said interpolation filter as the input samples are obtained, skipping activation of the interpolation filter when said means for varying changes from the first set of filter coefficients to the second set of filter coefficients, and activating the interpolation filter twice, using both the first set of filter coefficients and the second set of filter coefficients, when the means for varying changes from the second set of filter coefficients to the first set of filter coefficients.

14. The digital FM stereo demodulator of claim 13, wherein the filter operation controller delays activation of the interpolation filter according to said temporal distances from the most recent input sample.

15. The digital FM stereo demodulator of claim 9, wherein said means for digitally processing comprises at least one interpolation filter performing an interpolation process on the internal samples, thereby generating the stereo audio data at regular intervals.

16. The digital FM stereo demodulator of claim 9, wherein said means for digitally processing generates a pilot replica signal from the internal samples, and subtracts the pilot replica signal from the internal samples, thereby canceling the pilot signal.

17. An apparatus for demodulating a stereo composite signal, comprising:
  a converter to generate digital input samples of a received stereo composite signal carrying a pilot signal;
  a first processor to generate internal samples from the input samples using a variable internal sampling frequency;
  a signal generator to generate a reference signal based on the variable internal sampling frequency;
  a detector to detect phase difference between the pilot signal and the reference signal using the internal samples;
  a controller to vary the variable internal sampling frequency based on the detected phase difference; and
  at least a second processor to generate stereo audio data from the internal samples.

18. The apparatus of claim 17, wherein said first processor includes a decimator having a decimation interval being varied by the controller to vary the internal sampling frequency.

19. The apparatus of claim 17, wherein said first processor includes a filter to generate said input samples using interpolation and having coefficients being varied by the controller to vary the internal sampling frequency.

20. A machine-readable medium having stored thereon a plurality of executable instructions, the plurality of instructions comprising instructions to:
  generate digital input samples of a received stereo composite signal carrying a pilot signal;
  generate internal samples from the input samples using a variable internal sampling frequency;
  generate a reference signal based on the variable internal sampling frequency;
  detect phase difference between the pilot signal and the reference signal using the internal samples;
  vary the variable internal sampling frequency based on the detected phase difference; and
  generate stereo audio data from the internal samples.

21. The medium of claim 20, wherein said instructions to generate include instructions to generate said internal samples by decimation using a decimation interval being varied to vary the internal sampling frequency.

22. The medium of claim 20, wherein said instructions to generate include instructions to generate said internal samples by interpolation using coefficients being varied by the controller to vary the internal sampling frequency.

* * * * *